United States Patent [19]

Tanaka

[11] 4,060,768
[45] Nov. 29, 1977

[54] MEMORY TUNING SYSTEM WITH DUAL SPEED PROGRAMMING

[75] Inventor: Akio Tanaka, Chicago, Ill.

[73] Assignee: Zenith Radio Corporation, Glenview, Ill.

[21] Appl. No.: 646,116

[22] Filed: Jan. 2, 1976

[51] Int. Cl.² .............................................. H04B 1/16
[52] U.S. Cl. .................................. 325/464; 325/470; 325/468
[58] Field of Search ........ 325/452, 453, 455, 457–459, 325/464, 465, 468–470; 334/11, 14–16

[56] References Cited

U.S. PATENT DOCUMENTS

| | | | |
|---|---|---|---|
| 3,803,494 | 4/1974 | Howell | 325/459 |
| 3,821,651 | 6/1974 | Fathauer | 325/470 |
| 3,835,384 | 9/1974 | Liff | 325/464 X |
| 3,931,579 | 1/1976 | Ma | 325/464 |
| 3,940,702 | 2/1976 | Yoshimura | 325/464 |
| 3,943,449 | 3/1976 | Hendrickson | 325/420 |
| 3,953,801 | 4/1976 | Podowski | 325/464 |
| 3,961,267 | 6/1976 | Weissmueller | 325/470 |

*Primary Examiner*—Harold I. Pitts
*Attorney, Agent, or Firm*—Nicholas A. Camasto

[57] ABSTRACT

An all-channel two mode television tuning system includes a counter for generating channel numbers to adjust tuning. An 82 × 1 bit read/write memory is addressed in a program mode by the generated channel numbers to provide locations for storage of signals for tuning to preselected channels. Counting speed selection means control the counter to provide both fast and slow speeds in the program mode permitting convenient generation of any channel numbers. In the operate mode channel numbers are again generated, logic circuitry accesses the memory locations to determine if generated channel numbers correspond to preselected channel numbers, and channel number generation is automatically stopped when correspondence with a preselected channel number is determined.

4 Claims, 2 Drawing Figures

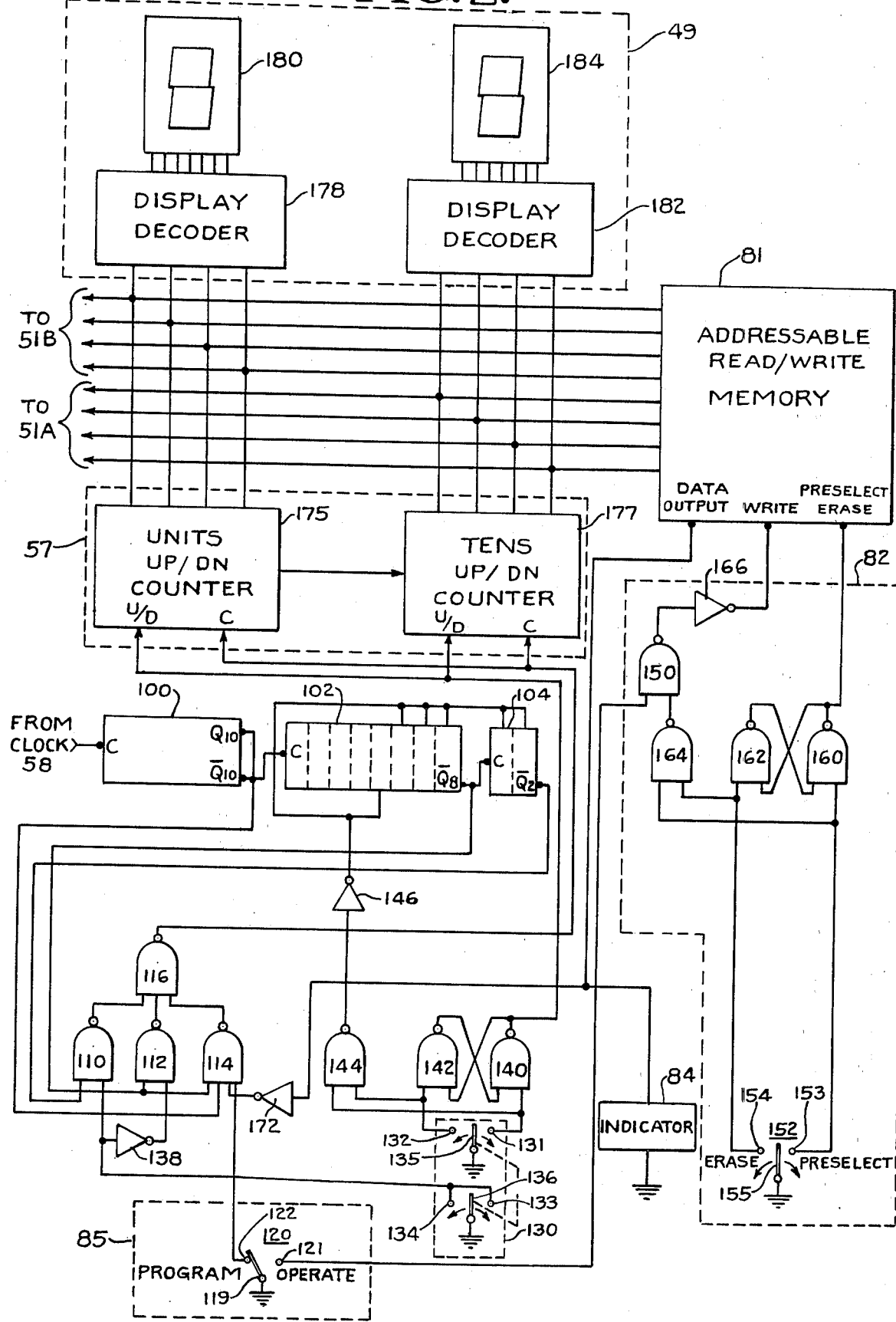

MEMORY TUNING SYSTEM WITH DUAL SPEED PROGRAMMING

CROSS REFERENCE TO RELATED APPLICATIONS

This application is related to application Ser. No. 621,911, filed Oct. 14, 1975, entitled "Sequential Channel Tuning System with a Memory", application Ser. No. 641,782, filed Dec. 18, 1975 entitled "Memory Tuning System with Different Speeds in Program and Operate Modes" and U.S. Pat. No. 4,005,368 issued Jan. 25, 1977, entitled "Memory Tuning System With Automatic Two Speed Display," all in the name of Akio Tanaka and assigned to Zenith Radio Corporation.

BACKGROUND OF THE INVENTION

This invention is related to varactor television tuning systems which vary tuning frequency by a change in the application of voltage to a varactor diode tuning device. More specifically, it relates to the form of varactor television tuning systems which selectively tune to desired television channels according to a predetermined channel program sequence which has been stored in a memory.

A versatile memory tuning system is completely disclosed and claimed in application Ser. No. 466,579, filed May 3, 1974, now U.S. Pat. No. 3,946,319 issued Mar. 23, 1976, in the names of John Ma & Akio Tanaka and entitled "All Electronic Digital Tuner System with Memory" and assigned to the assignee of the present application. The memory may be programmed in any desired sequence to provide sequential tuning among a selected group of channels. Storage locations are accessed to some convenient speed and tuning information is stored at individual locations. The advantages of such a tuning system with a memory are readily apparent since the viewer need sequence through only desired channels. The memory has sufficient capacity to hold the digits of the desired channel number, normally in binary encoded decimal form. The speed at which memory locations are accessed and the stored tuning information extracted is so rapid that the change of stored selections appears to be instantaneous.

A characteristic of all memory tuning systems is that they normally have two modes of operation, a program mode in which channel selections are made and an operate mode in which channel selections are recalled. With varactor diode tuners, channel selection involves supplying a proper DC tuning voltage to the tuner. The mechanism for supplying the proper voltages may range from digitally accessed adjustable potentiometers to binary memories for storing channel numbers. In the operate mode the viewer then only sweeps through the limited number of preselected channel numbers for tuning to the desired channel.

Application Ser. No. 457,010, filed Apr. 1, 1974, now U.S. Pat. No. 3,931,579 issued Jan. 6, 1976, in the name of Akio Tanaka entitled "Digital Signal Seeking Tuning System" and assigned to the assignee of the present application discloses a television tuning system which includes channel counters operating sequentially to generate desired channel numbers. As each channel number is generated the system responds by tuning to the frequency location corresponding to the channel number. The system also utilizes signal recognition means to determine if a receivable signal is present at that frequency location and stops additional channel number generation until reactivated by the viewer. This use of channel counters to generate channel number information greatly simplifies the tuning system for the viewer, but no provision is made for a memory to store selected information.

A memory of the type which could store selected tuning information could be added to a channel counter system to provide for a convenient method of selecting from all possible channels only those channels which the viewer desires. Such a memory is described in the related application, Ser. No. 621,911. As with all memory systems, in the program mode the operator selects among all available channels and creates the sequence of desired channels available in his locations for subsequent viewing. In the operate mode the viewer chooses from those selected channels the particular channel he wishes to view.

With this system a single device, the counter, both generates the tuning information and accesses the memory location to determine if it has been selected. A problem arises with a single speed system in that when making selections in the program mode, all channels cannot be sequentially generated in the same time. The time required for any individual would depend upon the starting count remaining on the counter. But there are only 12 possible VHF channels some of which may be numerically adjacent whereas in the UHF band there are 70 possible channels and in most locations broadcasting UHF channels are normally separated by six channel numbers.

VHF channels are generally available in all locations and therefore most viewers would normally select some channels numbered 13 or less. With a single speed counter operating to provide time for viewer recognition of channel numbers, the time required to generate the larger number and more widely displaced UHF channel numbers would be annoyingly long. Similarly, a fast counter permitting easy access to all UHF channels may well be too fast for making VHF selections without difficulty. The present invention memory tuning system employs counters and includes apparatus for controlling the speed at which the counters advance to generate channel number information to produce two speeds in the program mode. The viewer can control both direction and speed of the sequential counter advancement. The access time to channels is reduced since a fast speed can be used to skip unwanted channels and a slow speed can be used with channel number recognition to make the selection. Thus, the viewer can make comfortable selections of any channels during the program mode.

OBJECTS OF THE INVENTION

An object of this invention is to provide a novel tuning system.

Another object of this invention is to provide an improved memory tuning system which permits accurate programming with rapid access to all channels.

SUMMARY OF THE INVENTION

A television tuning system has counting means generating sequential channel number information for tuning all channels. Read/write memory means have a plurality of addressable locations for storage and recall of signals related to selected channel number information. The tuning system has a program mode for storage of the signals and an operate mode for recall from the memory of the signals to cause tuning to selected channels. Clock means are coupled to the counting means and produce timing pulses at regular intervals. Counting speed control means are coupled between the counting means and the clock means and operate in the program mode for changing the speed of the counting means to reduce the time required to sequentially generate any channel number.

BRIEF DESCRIPTION OF THE DRAWINGS

The features of the present invention which are believed to be novel are set forth with particularity in the appended claims. The invention, together with further objects and advantages thereof, may best be understood by reference to the following description taken in conjunction with the accompanying drawings, in the several figures of which like reference numerals identify like elements, and in which:

FIG. 2 shows the detailed circuitry of blocks 80, 81, 82, 83, 84 and 85 of FIG. 1.

DESCRIPTION OF THE PREFERRED EMBODIMENT

Figure 1:
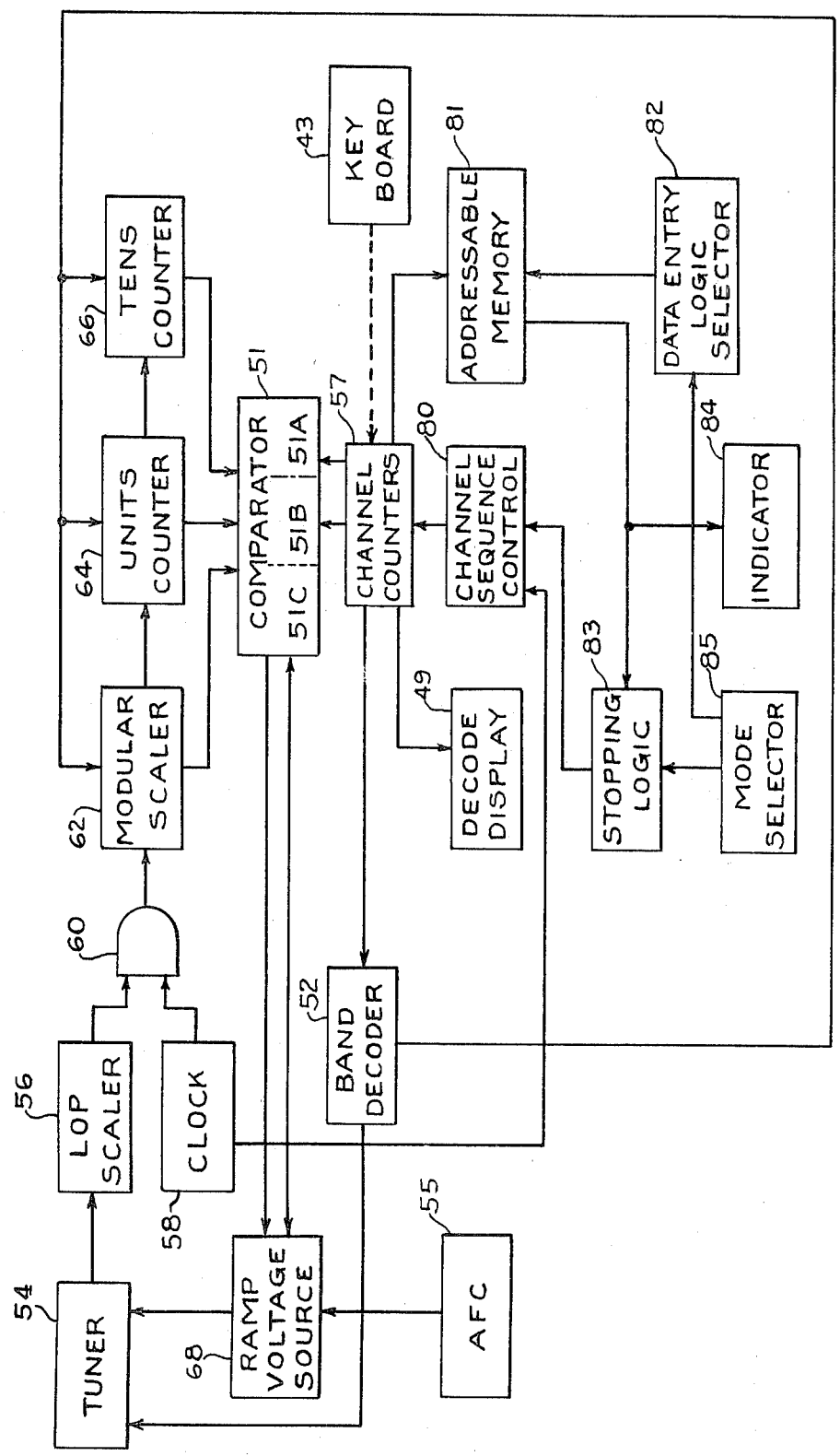
FIG. 1 depicts, in block diagram form, a tuning system employing the invention.

The preferred embodiment comprises circuitry for a bimodal television tuning system using channel counters to generate sequential channel numbers with the tuning system responding by tuning to the corresponding television channel. Of particular interest in the preferred embodiment of the invention is the operation of an addressable read/write memory. The generated channel numbers are made to correspond to unique locations or addresses in the memory. In the system program mode, additional circuitry allows the storing of a 1 or 0 logic level at that memory location to indicate respectively pre-selection or non-preselection of the corresponding channel number. As additional channel numbers are generated additional signals can be stored in the memory at corresponding locations to preselect any number of desired channels.

In the operate mode, the addressable read/write memory is interrogated at each location to determine if the corresponding channel number has been preselected. If the logic level at the corresponding memory location is at 1, the channel number has been preselected and the channel counters sequential generation of channel numbers is interrupted with the system tuning to that preselected channel. If the logic level at a location is 0 or when the viewer reactivates the switch to cause advancement of the channel counters, the counters advance at a high speed until arriving at the next preselected channel.

Practically speaking, the viewer sets the receiver to the program mode and sequences the channel number counters until a desired television channel signal is received. The control switch provides a two speed operation to conveniently generate any VHF or UHF channel number. He then sets the memory (by simply pushing a button) and sequences the counters to the next desired channel number, whereupon he again sets the memory appropriately. The speed at which the counter is sequenced is slow enough to allow the viewer time to recognize the channel number and make his selection. After programming the receiver to receive all desired channels, the receiver is placed in the operate mode. Thereafter in response to an Up or Down command (either by a push button or by remote control) the receiver channel counters operate a fast speed until the next preselected channel number in the memory is generated. Thus, only those preselected channel signals are receivable in the operate mode. All of the novel features of this tuning system are described in this application but the claims are limited to providing two speeds of channel number generation in the program mode. Other novel features will be claimed in subsequent applications.

FIG. 1 is a block diagram depicting a tuning system constructed in accordance with the invention. A clock pulse generator 58 supplies a train of regularly spaced pulses to a channel sequence control 80 which divides down the signal to provide various timing pulses and includes the logic gates for applying these timing pulses to channel counters 57. Channel counters 57 generate channel numbers and supply information directly to a comparator 51. A decode display unit 49 provides a visual indication of the generated channel number and is coupled directly to the output of channel counters 57. An additional output of channel counters 57 is coupled to an addressable memory 81 which contains a plurality of addressable locations. The generated channel numbers of channel counters 57 are employed to address the various locations of memory 81. The information stored at each of the addressable locations of memory 81 is determined by data entry logic selector 82. The output of addressable memory 81 is coupled to an indicator 84 to provide a visual display when the preselected channel number corresponds to the generated channel number. Addressable memory 81 is also coupled to stopping logic 83 which is coupled to channel sequence control 80. Channel sequence control 80 advances pulses to channel counters 57 for tuning and displaying the generated channel number and to address unique memory locations in addressable memory 81. A mode selector 85 is coupled to both a stopping logic circuit 83 and to a data entry logic selector 82. The position of mode selector 85 determines the system mode and, during the program mode, stopping logic 83 is disabled and data entry logic selector 82 is enabled to permit entry of data into the memory locations. In the operate mode, data entry logic selector is disabled and stopping logic 83 is enabled to interrupt the advancement of channel counters 57 when the generated channel number corresponds to a preselected number. A keyboard 43 is connected by a broken line as an optional connection to channel counters 57 which would permit tuning to a specific channel by presetting channel counters 57 to the desired channel number.

Another output of channel counters 57 is connected to a band decoder 52 which determines, from the encoded channel information in channel counters 57, 1) in which of the several discontinuous frequency bands the selected channel is; 2) which of UHF or VHF circuitry in the tuner is activated; and 3) the preset information supplied to the channel computing means for decoding of the oscillator frequency. Thus, an output of band decoder 52 is connected to a varactor tuner 54 and another output is connected in common to a modular scaler 62, a units counter 64 and a tens counter 66. A conventionally derived automatic frequency control voltage source (AFC) 55 is coupled to a ramp voltage source 68 for maintaining the oscillator frequency tuned to the received signal picture carrier frequency.

The output of a local oscillator frequency (LOF) scaler 56 and the output of clock pulse generator 58 are coupled to the inputs of a logic gate 60. The signal on the output of gate 60 constitutes the tuning information and comprises a train of oscillator frequency-related pulses in fixed time intervals. The oscillator frequency is determined by counting the number of pulses in an interval. The output of logic gate 60 is connected to modular scaler 62 which, in turn, is connected to units counter 64 which, in turn, is connected to tens counter 66. On a time sample basis, the tuning information is supplied to the appropriately preset modular scaler and units and tens counters which determine the channel number corresponding to the television frequency to which the tuner is tuned. The circuitry from the LOF scaler to the comparator constitutes the channel computing means.

The outputs of modular scaler 62 and counters 64 and 66 are connected to a comparator 51 which has a modular section 51C, a units section 51B and a tens section 51A. Sections 51B and 51A are also supplied the desired or selected channel number from channel counter 57. The derived (computed) channel number is compared with the desired channel number and signals dependent upon the condition of comparator 51 are coupled to ramp voltage source 68 for controlling both the tuning voltage direction and rate of change. The output voltage from ramp voltage source 68 drives tuner 54 to make corrective changes in its local oscillator frequency until comparator 51 indicates equality between the derived channel number and desired channel number.

DEFINITIONS

For simplicity, only logic connections are shown in the figures and only voltage sources and grounds necessary to establish the logic control signal levels are shown. Positive logic is used throughout and logic gates are simply referred to by their function names, i.e., AND, NAND, OR and NOR, without the word "gate". A 1 represents a high logic (or signal voltage) level and a 0 corresponds to a low logic level. Thus, an AND gate has its output at 1 only if all inputs are at 1; a NAND gate has its output at 0 only if all inputs are at 1; an OR gate has its output at 1 if any input is at 1; and a NOR gate has its output at 0 if any input is at 1. Inverters function to interchange the 1 and 0 levels.

The terms "input" and "output" generally indicate the device terminal unless signal is specified. The term "inhibit" indicates the condition in which a gate output is no longer dependent upon signals applied to its remaining inputs. The term "enable" designates the condition in which a gate output is dependent upon the signals applied to the remaining inputs.

The IC implementation for the logic circuit of the preferred embodiment is CMOS which designates complimentary symmetry-metal oxide semiconductor. Complimentary symmetry is a design arrangement in which N and P channel devices are symmetrically combined so that there is an active pull up and pull down effect on the output signal. MOS describes the form of fabrication of the various layers which constitute the electronic devices.

In FIG. 2 clock 58 is connected to the C terminal of a first flip/flop of a dividing circuit 100 which consists of 10 JK CMOS flip/flops connected in series, with the J and K terminals coupled to a voltage source to establish them at a 1 level. JK flip/flops have two conditioning inputs and one clock input and the response of the device depends upon the states of the conditioning inputs immediately prior to receiving a clock pulse. If both conditioning inputs (J & K) are at 0, the flip/flop will remain in its present state when a clock pulse is received; if the J input is at 1 and the K at 0, the flip/flop will go to the 1 condition; if the J is at 0 and the K at 1, the flip/flop will go to the 0 condition; if both J and K are at 1, the flip/flop will go to the complement or opposite state. The interconnection of flip/flops to provide binary counting is well known in the art and the numerical divisor for this series of flip/flops constituting dividing circuit 100 is 1024. The Q terminal of the 10th flip/flop of dividing circuit 100 is coupled to a first input of a NAND 114 and its $\bar{Q}$ terminal is coupled to the C terminal of a first flip/flop of dividing circuit 102.

Dividing circuit 102 consists of eight flip/flops arranged for binary counting in the same manner as dividing circuit 100 and has a numerical divisor of 256. The binary counting interconnections for dividing circuit 102 are also well known in the art. The $\bar{Q}$ terminal eighth flip/flop of dividing circuit 102 is coupled to a first input of a NAND 112, a second input of a NAND 114 and to the C terminal of the first flip/flop of dividing circuit 104. Dividing circuit 104 consists of two JK flip/flops which are interconnected in the same manner as dividing circuits 100 and 102 providing additional binary counting with a numerical divisor of 4. The $\bar{Q}$ terminal of the second flip/flop is coupled to a first input of a NAND 110.

The outputs of NAND's 110, 112 and 114 are coupled to the inputs of a NAND 116. The output of NAND 116 is coupled to the C terminals of a tens counter 177 and a units counter 175 which are enclosed by a dash line box and designated channel counters 57. A program-/operate switch 120 having a grounded contactor 119 is shown positioned for the operate mode. Contactor terminal 121 is coupled to a first input of a NAND 150 and contactor terminal 122 is coupled to a third input of NAND 114.

Momentary switch 130, enclosed by a broken line box, has a terminal 131 coupled to a first input of a NAND 140 and to the first input of a NAND 144. A terminal 132 is coupled to a first input of a NAND 142 and to a second input of NAND 144. Terminals 133 and 134 are connected together and to the input of an inverter 138 and to a second input of NAND 110. The output of inverter 138 is coupled to a second input of NAND 112. Although shown as separate switches a broken line couples grounded contactors 135 and 136 to indicate a mechanical connection. When pressure is applied to momentary switch 130, contactor 135 makes a connection with either of terminals 131 or 132. As additional pressure is applied contactor 136 makes a connection with corresponding terminals 133 or 134. This additional pressure on this switch in the preferred embodiment causes selectable faster sequencing of channel counters 57 which can occur only in the program mode. This feature helps equalize the generation time for VHF and UHF channel numbers. The preferred embodiment contains additional speed features but the claims of this application concern providing two speeds of channel number generation in the program mode.

NAND's 140 and 142 are cross connected to form an RS flip/flop. An RS flip/flop has only set (S) and reset (R) inputs. For the preferred embodiment, a 0 at the S terminal causes the output of the flip/flop to be at 1; a 0 at the R terminal causes the output to be at 0. A 0 at both the R and S results in an indeterminate state which is generally not allowed to occur. The output of NAND 142 is coupled to a second input of NAND 140 and the output of NAND 140 is coupled to a second input of NAND 142. The output of NAND 140 is coupled to the U/D terminals of units counter 175 and tens counter 177. The state of the NAND's 140 and 142 RS flip/flop arrangement establishes the counting direction of the tens and units counters by providing either a 1 or 0 voltage level.

NAND 144 is coupled through an inverter 146 to the fifth, sixth, seventh and eighth flip/flops of dividing circuit 102 and to both flip/flops of dividing circuit 104. The normal 0 signal at the output of NAND 144 is inverted to force a particular preset state into the dividing circuits 102 and 104 to provide a time delay. Forcing a preset effectively disables the counting action of dividing circuits 102 and 104.

To insure the relative logic levels in FIG. 2, switch terminals 121, 122, 131, 132, 133, 134, 153, 154 are coupled through a resistor to a source of voltage to establish them at a 1 level. When in direct contact with ground these terminals will be at a 0 level.

A momentary contact switch 152 has a grounded contactor 155, a preset terminal 153 coupled to a first input of a NAND 160 and to a first input of a NAND 164, and an erase terminal 154 coupled to a first input of a NAND 162 and to a second input of NAND 164. NAND's 160 and 162 are cross connected in the form of an RS flip/flop with the output of NAND 162 coupled to a second input of NAND 160 and the output of NAND 160 coupled to a second input of NAND 162. The output of NAND 160 is also coupled to the preselect/erase terminal of a read/write memory 81 and provides 0 and 1 voltage levels as the information for storage at the addressable locations. The output of NAND 164 is coupled to a second input of NAND 150. The output of NAND 150 is coupled through an inverter 166 the write terminal of read/write memory 81 for enabling the storing information at the various addressable locations. Channel counters 57 address particular locations in read/write memory 81 but no data may be stored until the write terminal is enabled. Memory 81 has a data output terminal coupled to an indicator 84 which is also coupled to ground and through an inverter 172 to a fourth input of NAND 114.

Units counter 175 is coupled to tens counter 177 to provide proper advancement of the tens counter for the 9-0 transition in the units counter. The units and tens counters each comprise well known binary counters and provide an encoding of the channel number digits. The output terminals of units counter 175 are coupled to a display decoder 178, to the address terminals of read/write memory 81 and to comparator 51B; the output terminals of tens counter 177 are coupled to a display decoder 182, to the address terminals of read/write memory 81 and to comparator 51A. Display decoder 178 is coupled to a display device 180 and, similarly, display decoder 182 is coupled to a display device 184 providing translation of the binary encoded channel number for a visual representation of the channel number. These are enclosed by a broken line and represent reference number 49 of FIG. 1.

Clock 58 supplies a series of timing pulses at a frequency approximately 2MHz. The numeric divisors for dividing circuits 100, 102 and 104 provide divided down timing pulses at the approximate frequencies of 2KHz, 8Hz and 2Hz respectively. These three frequencies of timing pulses provide three different speeds for the sequencing of channel counters 57. As stated earlier, the significance for this application is the speed difference in the program modes. The 2 and 8Hz pulse generation rates or frequencies comprise the two speeds in the program mode. The output of NAND 144 is normally at 0. When momentary contact switch 130 is actuated, either terminal 131 or 132 is grounded causing the output at NAND 144 to be at 1 for as long as the switch is maintained in that position. This 1 level signal is inverted by inverter 146 and releases the last four flip/flops of dividing circuit 102 and both flip/flops of dividing circuit 104 from their normally forced preset condition.

When the switch is released the flip/flops are no longer disabled and initially a particular binary configuration with the states of the first 14 flip/flops being ignored. Clock 58 continues to supply pulses to the dividing circuits and when all of the flip/flops go from the 1 to the 0 state the counting pulse for channel counters 57 is produced. This preset arrangement is arbitrary and provides a time delay before counting the clock signal to produce sequencing of channel counter 57. The length of the time delay is chosen to establish stabilization of all signals to prevent contact bounce.

NAND's 110, 112, 114 and 116 constitute a NAND-NAND cascade arrangement and, at the occurrence of all 1 level signals, at the inputs of any of NAND's 110, 112 and 114, the output from NAND 116 will also be at 1. NAND 110 accepts signal from dividing circuit 104 which corresponds to the approximate 2Hz counting frequency. NAND 112 accepts the signal from dividing circuit 102 which corresponds to the approximate 8Hz counting frequency or rate. Both NAND 110 and 112, in the alternative, pass the timing pulses through NAND 116 for advancement of the channel counters.

It should be noted that terminals 133 and 134 of momentary switch 130, which are normally at a 1 level, enable NAND 110 and through inverter 138 disable NAND 112 in both program and operate modes. Grounded contactor 136 contacting either terminal 133 or 134 results in the disabling of NAND 110 and the enabling of NAND 112 in either mode. In the operate mode either the 2 or 8Hz frequency is allowed to pass through NAND 110 or the very high speed 2KHz through NAND 114 as will be explained later. Normally only the 2Hz counting pulse rate will be used in the operate mode. In the program mode either gate 110 or 112 supplies counting pulses through NAND 116 to channel counters 57 and the speed is dependent upon the pressure applied to switch 130. Thus, two selectable speeds of counting are provided in the program mode. NAND 114 is also responsive to the signal from the last flip/flop of dividing circuit 102 to insure the proper timing relationship among all of the counting pulses.

With terminal 122 of switch 120 at 1 level (operate mode) NAND 114 is enabled to respond to a 0 level signal at the output of inverter 172 to terminate supplying counting pulses through NAND 116 which, as will be explained later, corresponds to detecting a preselected channel.

Although NAND's 110 and 112 are enabled only in the alternative in the program mode NAND 114 is enabled simultaneously with NAND 110 in the operate mode. In the operate mode, a 1 level at the output of inverter 172 enables NAND 114 to provide a train of counting pulses during the normal half cycle of the 8Hz pulse counting frequency. This operates as an override to provide very rapid (2KHz) advancement of the channel counters. The approximate 2KHz was chosen to provide counting through all possible channels during the half period of the 8Hz pulse frequency. Thus, if only one channel has been preselected then the system will advance through all possible channels and arrive again at the single preselected number. The circuit functions to rapidly skip all non-preselected channel numbers until it reaches another preselected channel number.

Units counter 175 and tens counter 177 are well known four stage binary counters interconnected to provide clocking for two digit channel numbers. The output of NAND 116 provides pulses to the counters which advance on each positive going edge. In the actual embodiment of the tuning system incorporating the invention, an up/down decade counter with preset terminals such as MCM 14516 is used. The preset feature of the up/down counter is incorporated to permit the inclusion of an external keyboard as shown by reference number 43 as an option in FIG. 1. The use of such a keyboard could force the establishment of a particular binary state into the counters thus causing tuning to a specific channel rather than automatically generating sequential channel numbers. As stated earlier, NAND 140 and 142 are coupled to form an RS flip/flop with the output of NAND 140 coupled to the U/D terminals of units counter 175 and tens counter 177, with a 1 corresponding to counting up and 0 corresponding to counting down.

At the outputs of channel counters 175 and 177 are standard binary encoded representation of the channel number digits. Display decoders 178 and 182 comprise circuitry for identifying the corresponding binary encoded units and tens digits and convert these into appropriate signals for a visual representation of the digits in display devices 180 and 184. In the preferred embodiment the display decoder is a BCD/7 segment device such as a MCM 14511 and the corresponding display devices are seven segment displays such as HP 7651 (LED). When the described devices are suitably connected the generated channel numbers can be visually displayed. The binary encoded outputs of channel counters 175 and 177 are also supplied to comparator 51B and 51A respectively. This portion of the comparator compares the derived channel number with the now generated channel number to control system tuning.

The binary encoded outputs of channel counters 175 and 177 are additionally supplied to read/write memory 81. In the preferred embodiment this memory is a 256 × 1 RAM (random access memory) of which 82 addressable locations are utilized. Such memories include decoding circuitry to convert binary encoded inputs to access unique locations. In the preferred embodiment a memory such as a CD 4061 is used.

When switch 120 is in the program mode, momentary contact switch 152 permits a viewer to preselect a given channel. The terminals of switch 152 are labeled preselect and erase. The erase terminal 154 is employed to remove a previously placed preselect signal at a location. Grounded contactor 155 contacting terminal 153 corresponds to preselecting a channel number corresponding to a unique address memory in 200. A 1 level signal is stored at that corresponding location. Similarly, grounded contactor 155 contacting terminal 154 places a 0 at the corresponding location. Data entry logic selector circuit 82 is the source for the signals to be placed in read/write memory 81. NAND's 160 and 162 are coupled as an RS flip/flop and a 0 level at terminal 153 causes the output of NAND 160 to be at 1 which corresponds to preselecting a given channel number. Similarly, a 0 level signal at terminal 154 causes the output of NAND 160 to be at 0 (erase).

Both inputs of NAND 164 are normally at 1 thus insuring that normally its output is at 0. With switch 120 in program mode the first input of NAND 150 is at 1 and when grounded contactor 155 contacts within terminal 153 or 154, the normally 0 output at NAND 164 becomes 1 for as long as contact is maintained. Since both inputs of NAND 150 are at 1 its output is 0 while the output of inverter 166 goes to 1. It is this positive going edge (from 0 to 1), resulting from activation of momentary switch 152, which causes storage of a signal corresponding to the logic state represented by the output of NAND 160 into the unique location which has been addressed by units and tens channel counters 175 and 177. In the operate mode the effect of momentary switch 152 is disabled since NAND 150 is inhibited to prevent any writing into memory. Thus, nothing can be changed in the memory wherein the system is in the operate mode.

In response to interrogation, a data output terminal of memory 81 supplies logic levels of the memory at the addressed location. As stated earlier, a 1 level corresponds to having preselected a corresponding channel number while a 0 indicates no preselection. This data output terminal is coupled to a display means which may comprise of a non-inverting buffer amplifier coupled to an ordinary LED which is connected through a resistor to ground. It will be appreciated that many forms of display units may be used which respond to a 1 level corresponding to a preselected channel by giving some type of visual indication.

The data output terminal of read/write memory 200 is also coupled through inverter 172 to an input of NAND 114. A 1 level at an addressable location produces a 0 level at the output of NAND 172 thus interrupting the very fast (approximate 2KHz) channel counting by channel counters 175 and 177. A 0 level at an addressable location produces a 1 level at the output of inverter 172 which enables NAND 114 to provide the 2KHz counting rate for rapid channel advancement. It should again be appreciated that NAND 114 is only enabled in the operate mode and, therefore, can not provide the rapid channel advancement when preselecting channel numbers in the program mode.

Activation of momentary switch 130 establishes counting at 2 or 8Hz rates in the program mode and once established it continues until the switch is released, thereby, forcing presets into dividing circuits 102 and 104 to disable their operation. In the operate mode if the switch is maintained in contact, the channel counters are not stopped but rather are advanced also at either 2 or 8Hz so that the viewer may observe the generated channel numbers and react. Now the very rapid channel number advancement provided through enabling NAND 114 in the operate mode allows rapid shipping through non-preselected channels while selected channels can be displayed for some convenient period. Although display devices 180 and 184 operate constantly there is no perceptable display during the rapid advancement. Continued activation of momentary switch 130 will cause continued advancement to the next preselected channel which will be displayed for a period of time and again the system will very rapidly advance to the next preselected channel.

What has been shown is a television tuning system which sequentially generates channel numbers to provide tuning to corresponding channels which have been previously selected and stored in a memory. In a program mode memory locations are accessible at either of two channel number generation speeds for storing signals related to selected channel numbers and in an operate mode a fast access speed is provided for searching the memory locations for the stored signals. This all channel tuning system is easily programmable for all VHF and UHF channels and has rapid access to the selected sequence of channels.

While there have been described particular embodiments of the present invention, it is apparent that changes and modifications may be made therein without departing from the invention in the broader aspects. The aim of the appended claims, therefore, is to cover all such changes and modifications as fall within the true spirit and scope of the invention.

What is claimed is:

1. A programmable television tuning system including:

counting means sequentially generating channel numbers for tuning all channels;

means communicating to the viewer the tens and units digits of channel numbers generated by said counting means;

read/write memory means coupled to said counting means having a plurality of addressable locations for storage and recall of signals related to selected channel numbers;

mode selection means for establishing a program mode for storage of said signals and an operate mode for recall from said memory means of said signals to cause tuning to selected channels;

clock means selectively coupled to said counting means and producing timing pulses at regular intervals; and counting speed control means, coupled between said clock means and said counting means and operating in said program mode for changing the counting speed of said counting means to reduce the time required to sequentially generate any channel number, said counting speed control means including (1) a plurality of flip/flops interconnected for continuous binary counting, responsive to said clock means and producing at least two distinct predetermined rates of counting pulses, and (2) a selector switch for selecting between said two distinct rates of counting pulses, said distinct rates being predetermined to permit a viewer to perceive counting by tens for the faster rate and counting by units for the slower rate.

2. The television tuning system of claim 1 wherein said individual predetermined rates of counting pulses are 2 and 8Hz.

3. The television tuning system of claim 2 wherein said counting speed control means further include a plurality of logic gates coupled to said plurality of interconnected flip/flops, wherein said selector switch is coupled to said plurality of logic gates for selectively enabling individual ones of said plurality of logic gates to supply to said counting means counting pulses at one of said two distinct predetermined rates.

4. The television tuning system of claim 3 wherein said counting speed control means further include means forcing a preset count into said plurality of flip/flops to prevent counting, said selector switch being coupled directly to said plurality of flip/flops to terminate said forced preset count to commence continuous counting of said timing pulses to produce said two distinct predetermined rates of counting pulses.

* * * * *